US012796508B2

(12) United States Patent
Bünning et al.

(10) Patent No.: US 12,796,508 B2
(45) Date of Patent: Nov. 10, 2026

(54) SEMICONDUCTOR DEVICE AND A METHOD OF MANUFACTURE

(71) Applicant: NEXPERIA B.V., Nijmegen (NL)

(72) Inventors: Hartmut Bünning, Nijmegen (NL); Hans-Juergen Funke, Nijmegen (NL); Stefan Berglund, Nijmegen (NL); Justin Y.H. Tan, Nijmegen (NL); Vegneswary Ramalingam, Nijmegen (NL); Roelf Groenhuis, Nijmegen (NL); Joep Stokkermans, Nijmegen (NL); Thijs Kniknie, Nijmegen (NL)

(73) Assignee: Nexperia B.V>, Nijmegen (NL)

( * ) Notice: Subject to any disclaimer, the term of this patent is extended or adjusted under 35 U.S.C. 154(b) by 0 days.

(21) Appl. No.: 17/380,220

(22) Filed: Jul. 20, 2021

(65) Prior Publication Data

US 2022/0020679 A1 Jan. 20, 2022

(30) Foreign Application Priority Data

Jul. 20, 2020 (EP) ..................................... 20186729

(51) Int. Cl.
*H10W 70/65* (2026.01)
*H10W 70/68* (2026.01)
(Continued)

(52) U.S. Cl.
CPC ......... *H10W 70/658* (2026.01); *H10W 70/68* (2026.01); *H10W 70/682* (2026.01); (Continued)

(58) Field of Classification Search
None
See application file for complete search history.

(56) References Cited

U.S. PATENT DOCUMENTS 6,340,842 B1 1/2002 Nakamura
6,867,499 B1 3/2005 Tabrizi
(Continued)

FOREIGN PATENT DOCUMENTS

JP 2020136507 A * 8/2020 ........... H01L 21/486

OTHER PUBLICATIONS

Extended European Search Report and Written Opinion for corresponding European application EP20186729.8, 12 pages dated Aug. 26, 2020.

*Primary Examiner* — Telly D Green
(74) *Attorney, Agent, or Firm* — Ruggiero McAllister & McMahon LLC

(57) ABSTRACT

A semiconductor device is provided that includes a substrate, a pocket within the substrate, a solderable/glueable re-distribution layer arranged in the pocket and a die. The die is arranged downwards, so that a base contact and an emitter contact of the die face the bottom of the device, and a collector contact of the die faces the top of the device. The solderable/glueable re-distribution layer includes a first and second re-distribution layer part and the first re-distribution layer part and the second re-distribution layer part are isolated from each other by an isolating material. The emitter contact is connected to the first re-distribution layer part and the base contact is connected to the second re-distribution layer part. The emitter contacts via the first re-distribution layer part, the base contacts via the second re-distribution layer part, and the collector contact are fan out to the top surface of the semiconductor device.

20 Claims, 5 Drawing Sheets

(51) Int. Cl.

| | |
|---|---|
| ***H10W 72/90*** | (2026.01) |
| ***H10W 74/10*** | (2026.01) |
| ***H10W 90/00*** | (2026.01) |

(52) U.S. Cl.

CPC ........ *H10W 72/926* (2026.01); *H10W 72/944* (2026.01); *H10W 74/141* (2026.01); *H10W 90/731* (2026.01); *H10W 90/791* (2026.01)

(56) References Cited

U.S. PATENT DOCUMENTS

| | | | | |
|---|---|---|---|---|
| 7,482,696 | B2 * | 1/2009 | Shei | H01L 33/60 257/778 |
| 8,343,784 | B2 * | 1/2013 | Park | H01L 33/486 257/E25.028 |
| 8,994,048 | B2 * | 3/2015 | Choi | H01L 24/97 257/528 |
| 9,111,464 | B2 * | 8/2015 | Bibl | H01L 33/58 |
| 9,159,700 | B2 * | 10/2015 | Sakariya | H01L 33/06 |
| 9,178,123 | B2 * | 11/2015 | Sakariya | H01L 33/06 |
| 9,252,375 | B2 * | 2/2016 | Bibl | H10K 59/12 |
| 9,305,852 | B1 | 4/2016 | Lopez et al. | |
| 9,484,504 | B2 * | 11/2016 | Bibl | H01L 33/504 |
| 9,927,499 | B2 * | 3/2018 | Yamagami | G01R 33/0052 |
| 9,991,426 | B2 * | 6/2018 | Hong | H01L 33/46 |
| 10,062,624 | B2 * | 8/2018 | Lopez | H01L 24/97 |
| 10,249,514 | B2 * | 4/2019 | Fuwa | H01L 23/49861 |
| 10,531,559 | B2 * | 1/2020 | Tanaka | H05K 1/111 |
| 10,566,509 | B2 * | 2/2020 | Hsu | H01L 33/486 |
| 2002/0008325 | A1 * | 1/2002 | Tominaga | H01L 24/81 257/E21.511 |
| 2007/0210340 | A1 * | 9/2007 | Zampardi | H01L 29/7371 257/E29.189 |
| 2010/0157568 | A1 * | 6/2010 | Ewe | H01L 24/24 438/114 |
| 2011/0198743 | A1 * | 8/2011 | Nikitin | H01L 24/80 257/E23.142 |
| 2013/0192388 | A1 * | 8/2013 | Kono | G01F 1/34 73/861.47 |
| 2014/0306331 | A1 * | 10/2014 | Otremba | H01L 23/49548 257/676 |
| 2016/0133616 | A1 * | 5/2016 | Lopez | H01L 27/088 438/107 |
| 2017/0038438 | A1 * | 2/2017 | Yamagami | H10N 52/80 |
| 2017/0054071 | A1 * | 2/2017 | Takeda | G01R 33/0206 |
| 2017/0301596 | A1 | 10/2017 | Lopez et al. | |
| 2018/0005993 | A1 * | 1/2018 | Chen | H01L 24/27 |
| 2020/0105961 | A1 * | 4/2020 | Boone | H10F 55/25 |

* cited by examiner

SEMICONDUCTOR DEVICE AND A METHOD OF MANUFACTURE

CROSS REFERENCE TO RELATED APPLICATION

This application claims the benefit under 35 U.S.C. § 119(a) of European Application No. 20186729.8 filed Jul. 20, 2020 the contents of which are incorporated by reference herein in their entirety.

BACKGROUND OF THE DISCLOSURE

1. Field of the Disclosure

The present disclosure relates to a semiconductor device. The disclosure also relates to a method of manufacturing a semiconductor device.

2. Description of the Related Art

A small outline transistor (SOT) is known in the art. It is a small footprint, discrete surface mount transistor commonly used in consumer electronics.

Surface-mount technology (SMT) is a method in which the electrical components are mounted directly onto the surface of a printed circuit board (PCB). An electrical component mounted in this manner is referred to as a surface-mount device (SMD). In industry, this approach has largely replaced the through-hole technology construction method of fitting components, in large part because SMT allows for increased manufacturing automation. Both technologies can be used on the same board, with the through-hole technology often used for components not suitable for surface mounting such as large transformers and heat-sinked power semiconductors.

An SMT component is usually smaller than its through-hole counterpart because it has either smaller leads or no leads at all. It may have short pins or leads of various styles, flat contacts, a matrix of solder balls (BGAs), or terminations on the body of the component.

Ever decreasing size of electronic systems demands smaller and thinner electronic components. An electronic component such as an integrated circuit typically uses a small piece of silicon wafer. However, its final size becomes much bigger after packaging and adding contact pins. Solder balls or pads are increasingly being used on the bottom of integrated circuits or discrete components to replace conventional metal pins and wire bonds. However, to improve system reliability, a semiconductor component (e.g., an integrated circuit) mostly needs to be packaged to provide sidewall protection and preventing cracks.

When device size is small, for example a millimetre or less, unprotected sidewalls may touch solder material and the device may malfunction. A known device is shown in FIG. 1. It shows a section of a system 100 in which a device 102 is shown as being soldered to solder pads on a PCB. As depicted, due to a small size, there is a likelihood that solder material 104 may touch sidewalls of the device 102.

A known device is shown in FIG. 2. There is a plurality of contact pads of devices fabricated in a semiconductor wafer 200. A plurality of identical devices may be fabricated simultaneously on a semiconductor wafer 200. Each device is shown to have two contact pads 204. However, in practice the device may have different number of contact pads depending on the type of device. If the device is a diode, two contact pads are necessary. However, if the device is a complex circuit having a plurality of components, the number of contact pads in each device may vary. An isolation layer 206 is formed over the surface of the semiconductor wafer 200. The isolation layer 206 may be made of a polyimide or a similar polymer that offers similar electrical isolation characteristics and strength. In some embodiments, silicon oxide may be used.

SUMMARY

Various example embodiments are directed to the disadvantage as described above and/or others which may become apparent from the following disclosure. According to an embodiment of this disclosure a semiconductor device comprises a pocket, a solderable or glueable re-distribution layer arranged in the pocket, a die comprising at least two contacts, an isolating material for isolating the contacts between each other, wherein all the contacts are fan out to a top surface of the semiconductor device.

The die can be for example a transistor comprising a base contact, a collector contact and an emitter contact.

The pocket may comprise sidewalls of about 45 degrees. According to an embodiment of this disclosure the die is arranged downwards, so that the base contact and the emitter contact are facing the bottom of the semiconductor device, and so that the collector contact is facing the top of the semiconductor device. The solderable or glueable re-distribution layer comprises a first re-distribution layer part and a second re-distribution layer part, wherein the first re-distribution layer part and the second re-distribution layer part are isolated from each other by the isolating material. The emitter contact is connected to the first re-distribution layer part and the base contact is connected to the second re-distribution layer part. In this way all three contacts, namely the emitter contact via the first re-distribution layer part, the base contact via the second re-distribution layer part, and the collector contact are fan out to the top surface of the semiconductor device.

According to an embodiment of this disclosure the die is arranged upwards, so that the base contact and the emitter contact are facing the top of the semiconductor device, and so that the collector contact is facing the bottom of the semiconductor device. The collector contact is connected to the re-distribution layer. In this way, all three contacts, namely the emitter contact, the base contact, and the collector contact via the re-distribution layer, are fan out to the top surface of the semiconductor device.

According to an embodiment of this disclosure the die is arranged on side. The solderable or glueable re-distribution layer comprises a first re-distribution layer part and a second re-distribution layer part, wherein the first re-distribution layer part and the second re-distribution layer part are isolated from each other by the isolating material. The second re-distribution layer part comprises a third re-distribution layer part and a fourth re-distribution layer part, wherein the third re-distribution layer part and the fourth re-distribution layer part are isolated from each other by the isolating material. The collector contact is connected to the first re-distribution layer part, the emitter contact is connected to the third re-distribution layer part, and the base contact is connected to the fourth re-distribution layer part. In this way all three contacts, namely the collector contact via the first re-distribution layer part, the collector contact via the third re-distribution layer part, and the base contact via the fourth re-distribution layer part are fan out to the top surface of the semiconductor device.

The disclosure also relates to an automotive part comprising a semiconductor device as described in the example embodiments above and any similar embodiments.

The disclosure also relates to a method of producing a semiconductor device as described in the example embodiments above and any similar embodiments.

According to an embodiment of this disclosure a method of producing a semiconductor device comprises the steps:

providing a substrate, creating a pocket with a first sidewall of about 45 degrees and a second sidewall of about 45 degrees on the opposite side in respect to the first sidewall, providing a first solder or glue re-distribution layer part on the first wall and providing a second solder glue re-distribution layer part on the second wall, providing a die, wherein the die comprises a collector contact, a base contact and an emitter contact, wherein the base contact and emitter contact are oriented downwards, facing the bottom of the semiconductor device, wherein the collector contact is oriented upwards, facing the top of the semiconductor device, providing an isolation material that is isolating the first re-distribution layer part from the second re-distribution layer part, wherein the emitter contact is connected to the first re-distribution layer part and the base contact is connected to the second re-distribution layer part, so that the emitter contact via the first re-distribution layer part, the base contact via the second re-distribution layer part, and the collector contact are fan out to the top surface of the semiconductor device.

According to an embodiment of this disclosure a method of producing a semiconductor device comprises the steps:

providing a substrate, creating a pocket with a first sidewall of about 45 degrees and a second sidewall of about 45 degrees on the opposite side in respect to the first sidewall, providing a first solder or glue re-distribution layer part on the first wall, providing a die, wherein the die comprises a collector contact, a base contact and an emitter contact, wherein the base contact and emitter contact are oriented upwards, facing the top of the semiconductor device, wherein the collector contact is oriented downwards, facing the bottom of the semiconductor device, providing an isolation material between the die and the pocket, wherein the collector contact is connected to the first re-distribution layer part, so that the emitter contact, the base contact, and the collector contact via the first re-distribution layer part are fan out to the top surface of the semiconductor device.

According to an embodiment of this disclosure a method of producing a semiconductor device comprises the steps:

providing a substrate, creating a pocket with a first sidewall of about 45 degrees and a second sidewall of about 45 degrees on the opposite side in respect to the first sidewall, providing a first solder or glue re-distribution layer part on the first wall and providing a second solder or glue re-distribution layer part on the second wall, wherein the second re-distribution layer part comprises a third re-distribution layer part and a fourth re-distribution layer part, providing a die, wherein the die comprises a collector contact, a base contact and an emitter contact, wherein the die is arranged on side in respect to the semiconductor device providing an isolation material that is isolating the first re-distribution layer part, the third re-distribution layer part and the fourth re-distribution layer part from each other, wherein the collector contact is connected to the first re-distribution layer part, the emitter contact is connected to the third re-distribution layer part, and the base contact is connected to the fourth re-distribution layer part, so that the collector contact via the first re-distribution layer part, the collector contact via the third re-distribution layer part, and the base contact via the fourth re-distribution layer part are fan out to the top surface of the semiconductor device.

A semiconductor device and a method of producing a semiconductor device as described in the example embodiments above, or any similar embodiments, has all contacts on the same side. Such fan out of the semiconductor device contacts secures the low costs of the semiconductor device production and at the same time eliminates the need for wire bond, lead frames and/or moulding.

Additional advantage is that the package of this semiconductor device does not require vias since the form of the carrier allows to have only one redistribution layer on one side of the carrier.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

An embodiment of the disclosure relates to a vertical designed semiconductor device, e.g. a diode, a transistor, etc. having solderable/glueable contacts on both sides of the semiconductor device, wherein the semiconductor device is placed inside a pre-formed carrier. The preformed carrier is coated with conductive paths allowing to move all contacts to one side of the package of the semiconductor device.

The pre-formed carrier is designed with bevelled side walls to allow the application of a solderable/glueable redistribution layer, conductor tracks, on top of the pre-formed carrier surface. The paths can be created e.g. using printing, plating or equivalent technologies.

Since all contacts are on one side of the semiconductor device, an easy assembly is enabled.

The semiconductor device, which will be placed inside a pre-formed pocket of a fan-out carrier, requires solderable/glueable contacts on both, the top and the bottom surface.

The semiconductor device can be placed inside a pre-formed pocket and soldered/glued to a redistribution layer.

Figure 1:
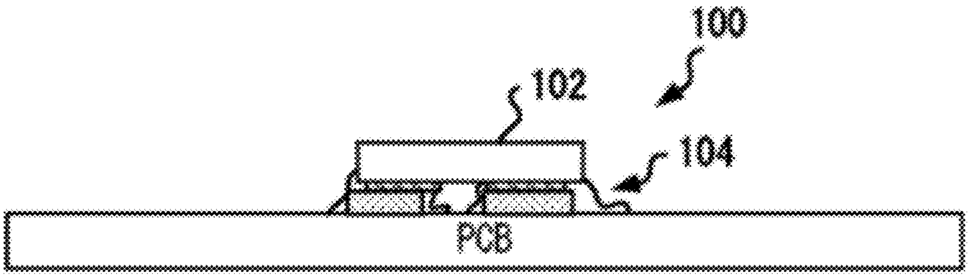
Fig 1 (Prior Art)
FIG. 1 shows a known device known in the art.
Figure 2:
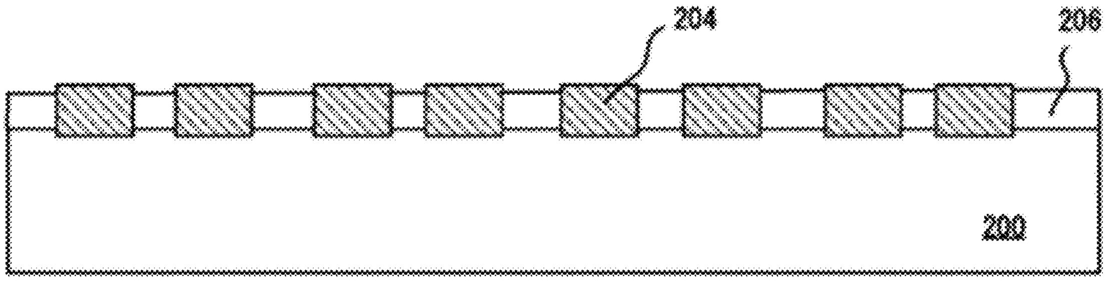
Fig 2 (Prior Art)
FIG. 2 shows a known device known in the art.
Figure 3:
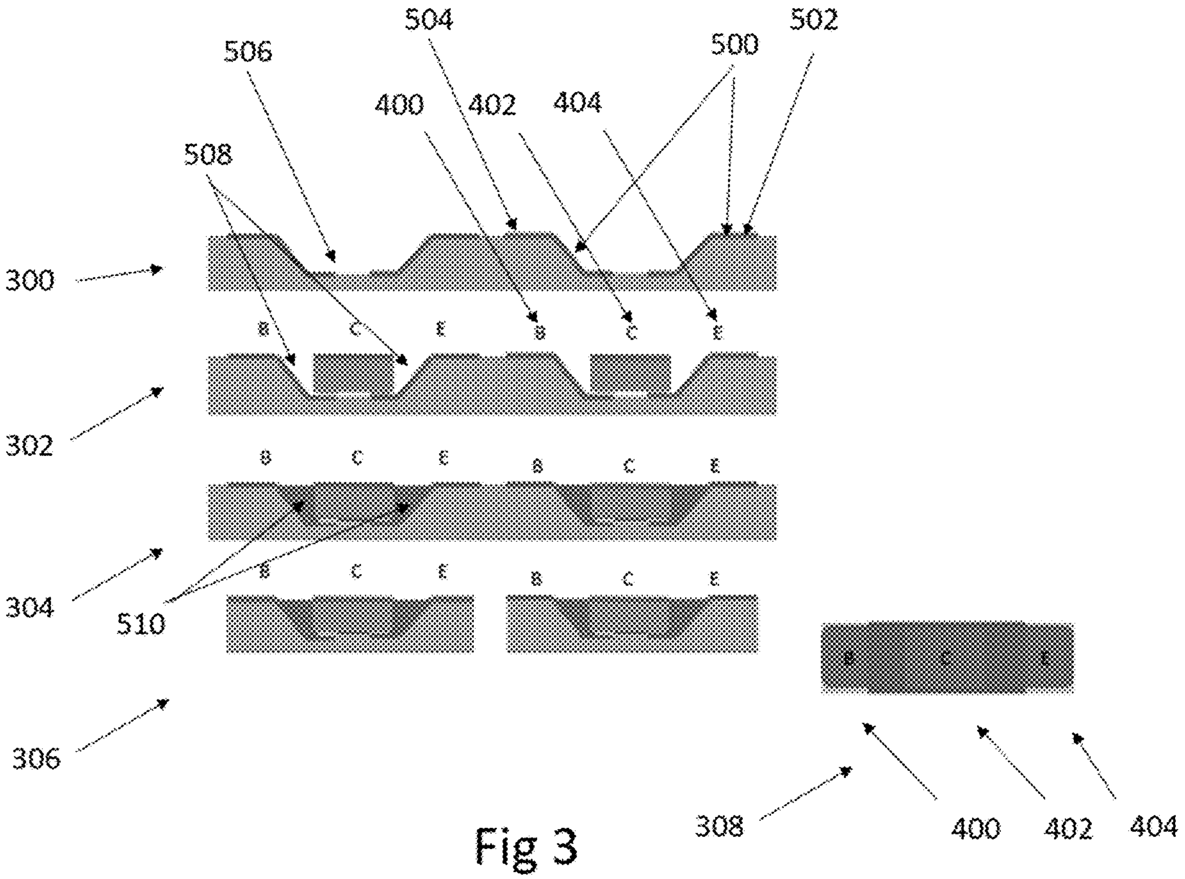
FIG. 3 illustrates a semiconductor device according to an embodiment of the disclosure in a flipped configuration.

An embodiment of the disclosure is shown in FIG. 3. In this example the embodiment is presented for a transistor 308 comprising a base 400, a collector 402 and an emitter 404. However, the embodiment is not limited to this transistor example, it is applicable to any semiconductor device.

According to a method of this embodiment, as indicated with the reference number 300 in FIG. 3, pockets 506 with a sidewall of about 45 degrees or any other suitable angle are created. The pockets 506 are partially coated with a solderable/glueable re-distribution layer 500. This can be achieved by printing, plating, or any other equivalent technology. The solderable/glueable re-distribution layer 500 comprises a first re-distribution layer part 502 and a second re-distribution layer part 504.

In the step indicated with the reference number 302 in FIG. 3, a die, comprising a base contact and an emitter contact, is placed with its face downwards, i.e. flipped, in the pocket. In this way the base contact 400 and the emitter contact 404 are connected to the second re-distribution layer part 504 and the second re-distribution layer part 502 respectively.

The connection between the base contact 400 and the emitter contact 404 and the second re-distribution layer part 504 and the first re-distribution layer part 502 can be done glue, soldering, or any other suitable way.

In the step indicated with the reference number 304 in FIG. 3, the gaps 508 between the dies and the pockets are filled with an isolating material 510. Such an isolating material secures the stability of the dies and protects the dies against environment.

In the step indicated with the reference number 306 in FIG. 3, a separation of the transistors is executed. A top view of a separated transistor is indicated with the reference number 308.

A semiconductor device, in this particular example a transistor, has all contacts on the same side. Such fan out of the transistor contacts secures the low costs of the semiconductor device production and at the same time eliminates the need for wire bond, lead frames and/or moulding.

Additional advantage is that the package of this semiconductor device does not require vias since the form of the carrier allows to have only one redistribution layer on one side of the carrier.

There are various usages of such a semiconductor device next to the example of transistor packages shown in FIG. 3.

Figure 4:
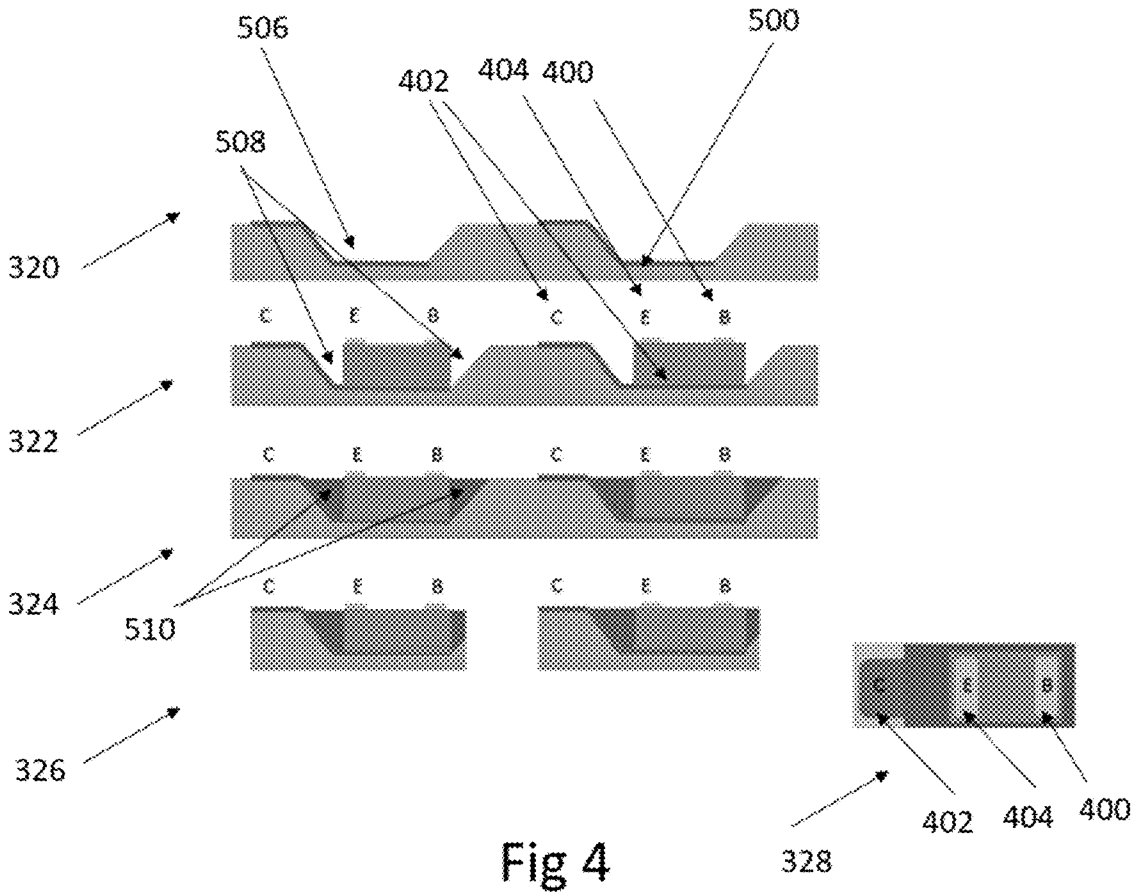
FIG. 4 illustrates a semiconductor device according to an embodiment of the disclosure in a non-flipped configuration.

An embodiment of the disclosure is shown in FIG. 4. In this example the embodiment is presented for a transistor 328 comprising a base 400, a collector 402 and an emitter 404. However, the embodiment is not limited to this transistor example, it is applicable to any semiconductor device.

According to a method of this embodiment, as indicated with the reference number 320 in FIG. 4, pockets 506 with a sidewall of about 45 degrees or any other suitable angle are created. The pockets 506 are partially coated with a solderable/glueable re-distribution layer 500. This can be achieved by printing, plating, or any other equivalent technology.

In the step indicated with the reference number 322 in FIG. 4, a die, comprising a base contact 400 and an emitter contact 404, is placed with its face upwards, in the pocket 506. The collector contact 402 is placed with its face downwards. In this way the collector contact 402 is connected to the solderable/glueable re-distribution layer 500.

The connection between the collector contact 402 and the solderable/glueable re-distribution layer 500 can be done glue, soldering, or any other suitable way.

In the step indicated with the reference number 324 in FIG. 4, the gaps 508 between the dies and the pockets are filled with an isolating material 510. Such an isolating material secures the stability of the dies and protects the dies against environment.

In the step indicated with the reference number 326 in FIG. 4, a separation of the transistors is executed. A top view of a separated transistor is indicated with the reference number 328.

Similarly to the transistor 308 shown in FIG. 3, the transistor 328 shown in FIG. 4 has all contacts on the same side. Such fan out of the transistor contacts secures the low costs of the semiconductor device production and at the same time eliminates the need for wire bond, lead frames and/or moulding.

The package of this semiconductor device does not require vias since the form of the carrier allows to have only one redistribution layer on one side of the carrier.

Figure 5:
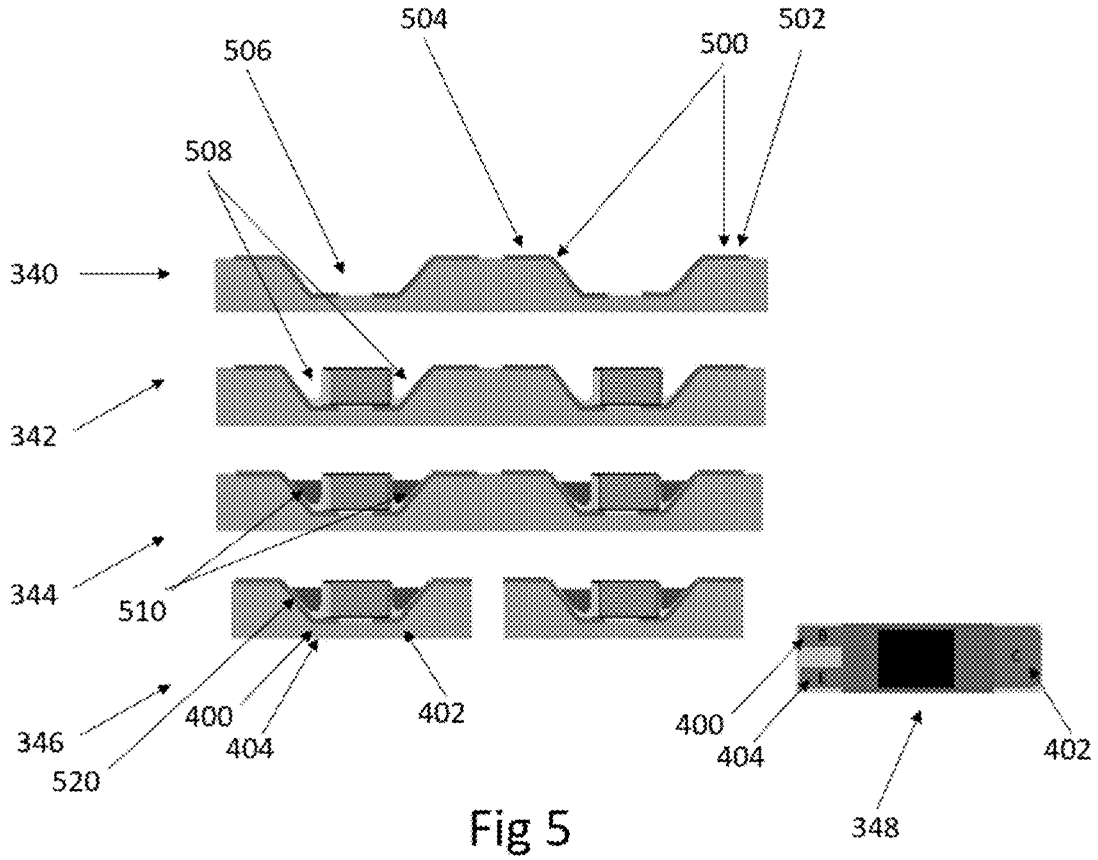
FIG. 5 illustrates a semiconductor device according to an embodiment of the disclosure in a configuration with mounted side walls.

An embodiment of the disclosure is shown in FIG. 5. In this example the embodiment is presented for a transistor 348 comprising a base 400, a collector 402 and an emitter 404. However, the embodiment is not limited to this transistor example, it is applicable to any semiconductor device.

According to a method of this embodiment, as indicated with the reference number 340 in FIG. 5, pockets 506 with a sidewall of about 45 degrees or any other suitable angle are created. The pockets 506 are partially coated with a solderable/glueable re-distribution layer 500. This can be achieved by printing, plating, or any other equivalent technology. The solderable/glueable re-distribution layer 500 comprises a first re-distribution layer part 502 and a second re-distribution layer part 504. The second re-distribution layer part 504 comprises two parts, a third re-distribution layer part 520 and a fourth re-distribution layer part which are isolated from each other. The third re-distribution layer part 520 is visible in FIG. 5, while the fourth re-distribution layer part is behind the third re-distribution layer part and it is therefore not visible in FIG. 5.

In the step indicated with the reference number 342 in FIG. 5, a die, comprising a base contact 400, the collector contact 402 and an emitter contact 404, is placed on side in the pocket. The side walls of the die are insulated. In this way the collector contact 402 is connected to the first re-distribution layer part 502. The emitter contact 404 and the base contact 400 are connected to the third re-distribution layer part 520 and the fourth re-distribution layer part, respectively.

The connection between the collector contact 402, the base contact 400 and the emitter contact 404 with the first re-distribution layer part 502, the third re-distribution layer part 520 and the fourth re-distribution layer part, respectively, can be done glue, soldering, or any other suitable way.

In the step indicated with the reference number 344 in FIG. 5, the gaps 508 between the dies and the pockets are filled with an isolating material 510. Such an isolating material secures the stability of the dies and protects the dies against environment.

In the step indicated with the reference number 346 in FIG. 5, a separation of the transistors is executed. A top view of a separated transistor is indicated with the reference number 348.

Similarly to the transistors 308 and 328 shown in FIG. 3 and FIG. 4 respectively, the transistor 348 shown in FIG. 5 has all contacts on the same side. Such fan out of the transistor contacts secures the low costs of the semiconductor device production and at the same time eliminates the need for wire bond, lead frames and/or moulding.

The package of this semiconductor device does not require vias since the form of the carrier allows to have only one redistribution layer on one side of the carrier.

Although there are just three example embodiments of the disclosure shown on FIGS. 3, 4 and 5, the scope of this invention covers all similar embodiments, and also the embodiments with simple/trivial modification(s) of the elements of these embodiments.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A semiconductor device comprising:

a pocket;

a die comprising at least two contacts, at least one of the contacts being on a bottom surface of the die and at least one of the contacts being on a top surface of the die, the die being arranged in the pocket to form a gap between a sidewall of the die and a sidewall of the pocket;

an isolating material for isolating the contacts between each other, the isolating material filling the gap between the sidewall of the die and the sidewall of the pocket; and a solderable or glueable re-distribution layer arranged in the pocket that electrically connects the at least one contact on the bottom surface of the die, the re-distribution layer comprising a portion that is exposed on a top surface of the semiconductor device so that all the contacts are fanned out to the top surface of the semiconductor device, wherein the isolating material isolates the fanned out contacts between each other and does not cover top surfaces of the portion of the re-distribution layer and all the contacts fanned out to the top surface of the semiconductor device.

2. The semiconductor device as claimed in claim 1, wherein the die is a transistor comprising a base contact, a collector contact and an emitter contact.

3. The semiconductor device as claimed in claim 1, wherein the pocket comprises a sidewall about 45 degrees.

4. The semiconductor device as claimed in claim 2, wherein the pocket comprises a sidewall about 45 degrees.

5. The semiconductor device as claimed in claim 2, wherein the die is arranged downwards, so that the base contact and the emitter contact are facing a bottom of the semiconductor device, and so that the collector contact is facing the top of the semiconductor device, wherein the solderable or glueable re-distribution layer comprises a first re-distribution layer part and a second re-distribution layer part, wherein the first re-distribution layer part and the second re-distribution layer part are isolated from each other by the isolating material, wherein the emitter contact is connected to the first re-distribution layer part and the base contact is connected to the second re-distribution layer part, and wherein the emitter contact via the first re-distribution layer part, the base contact via the second re-distribution layer part, and the collector contact are fan out to the top surface of the semiconductor device.

6. The semiconductor device as claimed in claim 4, wherein the die is arranged downwards, so that the base contact and the emitter contact are facing a bottom of the semiconductor device, and so that the collector contact is facing the top of the semiconductor device, wherein the solderable or glueable re-distribution layer comprises a first re-distribution layer part and a second re-distribution layer part, wherein the first re-distribution layer part and the second re-distribution layer part are isolated from each other by the isolating material, wherein the emitter contact is connected to the first re-distribution layer part and the base contact is connected to the second re-distribution layer part, and wherein the emitter contact via the first re-distribution layer part, the base contact via the second re-distribution layer part, and the collector contact are fan out to the top surface of the semiconductor device.

7. The semiconductor device as claimed in claim 2, wherein the die is arranged upwards, so that the base contact and the emitter contact are facing the top of the semiconductor device, and so that the collector contact is facing a bottom of the semiconductor device, wherein the collector contact is connected to the re-distribution layer, and wherein the emitter contact, the base contact, and the collector contact via the re-distribution layer, are fan out to the top surface of the semiconductor device.

8. The semiconductor device as claimed in claim 3, wherein the die is arranged upwards, so that the base contact and the emitter contact are facing the top of the semiconductor device, and so that the collector contact is facing a bottom of the semiconductor device, wherein the collector contact is connected to the re-distribution layer, and wherein the emitter contact, the base contact, and the collector contact via the re-distribution layer, are fan out to the top surface of the semiconductor device.

9. The semiconductor device as claimed in claim 2, wherein the die is arranged on a side, wherein the solderable or glueable re-distribution layer comprises a first re-distribution layer part and a second re-distribution layer part, wherein the first re-distribution layer part and the second re-distribution layer part are isolated from each other by the isolating material, wherein the second re-distribution layer part comprises a third re-distribution layer part and a fourth re-distribution layer part, wherein the third re-distribution layer part and the fourth re-distribution layer part are isolated from each other by the isolating material, wherein the collector contact is connected to the first re-distribution layer part, the emitter contact is connected to the third re-distribution layer part, and the base contact is connected to the fourth re-distribution layer part, and wherein the collector contact via the first re-distribution layer part, the collector contact via the third re-distribution layer part, and the base contact via the fourth re-distribution layer part are fan out to the top surface of the semiconductor device.

10. The semiconductor device as claimed in claim 3, wherein the die is arranged on a side, wherein the solderable or glueable re-distribution layer comprises a first re-distribution layer part and a second re-distribution layer part, wherein the first re-distribution layer part and the second re-distribution layer part are isolated from each other by the isolating material, wherein the second re-distribution layer part comprises a third re-distribution layer part and a fourth re-distribution layer part, wherein the third re-distribution layer part and the fourth re-distribution layer part are isolated from each other by the isolating material, wherein the collector contact is connected to the first re-distribution layer part, the emitter contact is connected to the third re-distribution layer part, and the base contact is connected to the fourth re-distribution layer part, and wherein the collector contact via the first re-distribution layer part, the collector contact via the third re-distribution layer part, and the base contact via the fourth re-distribution layer part are fan out to the top surface of the semiconductor device.

11. The semiconductor device as claimed in claim 1, wherein at least one of the contacts is directly on the bottom surface of the die and at least one of the contacts is directly on the top surface of the die.

12. An automotive part comprising a semiconductor device as claimed in claim 1.

13. A method of producing a semiconductor device as claimed in claim 1.

14. The method of producing a semiconductor device as claimed in claim 13, the method comprising the steps of:

providing a substrate;

creating a pocket with a first sidewall of about 45 degrees and a second sidewall of about 45 degrees on a opposite side with respect to the first sidewall;

providing a first solder or glue re-distribution layer part on the first sidewall and providing a second solder or glue re-distribution layer part on the second sidewall;

providing a die, wherein the die comprises a collector contact, a base contact and an emitter contact, the die being arranged in the pocket to form at least one gap between a sidewall of the die and at least one of the first sidewall or the second sidewall of the pocket, wherein the base contact and emitter contact are oriented downwards, facing a bottom of the semiconductor device, wherein the collector contact is oriented upwards, facing a top of the semiconductor device, providing an isolation material that is isolating the first re-distribution layer part from the second re-distribution layer part, the isolating material filling the at least one gap between the sidewall of the die and at least one of the first sidewall or the sidewall of the pocket, wherein the emitter contact is connected to the first re-distribution layer part and the base contact is connected to the second re-distribution layer part, so that the emitter contact via the first re-distribution layer part, the base contact via the second re-distribution layer part, and the collector contact are fan out to the top surface of the semiconductor device.

15. The method of producing a semiconductor device as claimed in claim 13, the method comprising the steps of:

providing a substrate;

creating a pocket with a first sidewall of about 45 degrees and a second sidewall of about 45 degrees on a opposite side with respect to the first sidewall;

providing a first solder or glue re-distribution layer part on the first sidewall;

providing a die, wherein the die comprises a collector contact, a base contact and an emitter contact, the die being arranged in the pocket to form at least one gap between a sidewall of the die and at least one of the first side wall or the second sidewall of the pocket, wherein the base contact and emitter contact are oriented upwards, facing a top of the semiconductor device, wherein the collector contact is oriented downwards, facing a bottom of the semiconductor device, providing an isolation material between the die and the pocket, the isolating material filling the at least one gap between the sidewall of the die and at least one of the first sidewall or the sidewall of the pocket, wherein the collector contact is connected to the first re-distribution layer part, so that the emitter contact, the base contact, and the collector contact via the first re-distribution layer part are fan out to the top surface of the semiconductor device.

16. The method of producing a semiconductor device as claimed in claim 12, the method comprising the steps of:

providing a substrate;

creating a pocket with a first sidewall of about 45 degrees and a second sidewall of about 45 degrees on a opposite side with respect to the first sidewall;

providing a first solder or glue re-distribution layer part on the first sidewall and providing a second solder or glue re-distribution layer part on the second sidewall, wherein the second re-distribution layer part comprises a third re-distribution layer part and a fourth re-distribution layer part, providing a die, wherein the die comprises a collector contact, a base contact and an emitter contact, wherein the die is arranged on a side with respect to the semiconductor device, the die being arranged in the pocket to form at least one gap between a sidewall of the die and at least one of the first side wall or the second sidewall of the pocket; and providing an isolation material that is isolating the first re-distribution layer part, the third re-distribution layer part and the fourth re-distribution layer part from each other, the isolating material filling the at least one gap between the sidewall of the die and at least one of the first sidewall or the sidewall of the pocket, wherein the collector contact is connected to the first re-distribution layer part, the emitter contact is connected to the third re-distribution layer part, and the base contact is connected to the fourth re-distribution layer part, so that the collector contact via the first re-distribution layer part, the collector contact via the third re-distribution layer part, and the base contact via the fourth re-distribution layer part are fan out to a top surface of the semiconductor device.

17. The semiconductor device as claimed in claim 1, wherein the isolating material fills the gap between the sidewall of the die and the sidewall of the pocket so as to environmentally protect and secure the stability of the die.

18. The method of producing the semiconductor device as claimed in claim 14, wherein the isolating material fills the at least one gap between the sidewall of the die and the at least one of the first sidewall or the second sidewall of the pocket so as to environmentally protect and secure the stability of the die.

19. The method of producing the semiconductor device as claimed in claim 15, wherein the isolating material fills the at least one gap between the sidewall of the die and the at least one of the first sidewall or the second sidewall of the pocket so as to environmentally protect and secure the stability of the die.

20. The method of producing the semiconductor device as claimed in claim 16, wherein the isolating material fills the at least one gap between the sidewall of the die and the at least one of the first sidewall or the second sidewall of the pocket so as to environmentally protect and secure the stability of the die.

* * * * *